United States Patent
Zhao et al.

(10) Patent No.: US 7,573,285 B2
(45) Date of Patent: Aug. 11, 2009

(54) MULTIPLE POINT GATE OXIDE INTEGRITY TEST METHOD AND SYSTEM FOR THE MANUFACTURE OF SEMICONDUCTOR INTEGRATED CIRCUITS

(75) Inventors: Atman Zhao, Shanghai (CN); Summer Tseng, Shanghai (CN); W. T. Kary Chien, Shanghai (CN); Excimer Gong, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 0 days.

(21) Appl. No.: 12/134,791

(22) Filed: Jun. 6, 2008

(65) Prior Publication Data

US 2009/0009209 A1 Jan. 8, 2009

Related U.S. Application Data

(62) Division of application No. 11/227,182, filed on Sep. 14, 2005, now Pat. No. 7,396,693.

(51) Int. Cl.
  G01R 31/26 (2006.01)
(52) U.S. Cl. .................. 324/769; 324/765; 324/763; 324/73.1
(58) Field of Classification Search .......... 324/763, 324/765, 769, 158.1, 73.1; 702/117–119; 714/733–734; 438/14–18; 716/4
See application file for complete search history.

(56) References Cited

U.S. PATENT DOCUMENTS 5,889,409 A * 3/1999 Kalb, Jr. ............... 324/765
6,414,508 B1   7/2002 London
6,574,760 B1 * 6/2003 Mydill ................. 714/724

(Continued)

OTHER PUBLICATIONS

Office Action of U.S. Appl. No. 11/227,182 dated Sep. 14, 2005, 8 pages total.

*Primary Examiner*—Ha Tran T Nguyen
*Assistant Examiner*—Arleen M Vazquez
(74) *Attorney, Agent, or Firm*—Townsend and Townsend and Crew LLP

(57) ABSTRACT

A method for testing a semiconductor wafer using an in-line process control, e.g., within one or more manufacturing processes in a wafer fabrication facility and/or test/sort operation. The method includes transferring a semiconductor wafer to a test station. The method includes applying an operating voltage on a gate of a test pattern on a semiconductor wafer using one or more probing devices. The method includes measuring a first leakage current associated with the operating voltage. If the measured first current is higher than a first predetermined amount, the device is an initial failure. If the measured first current is below the first predetermined amount, the device is subjected to a second voltage. The method includes applying the second voltage on the gate of the test pattern on the semiconductor wafer and measuring a second leakage current associated with the second voltage. If the second measured leakage current is higher than a second predetermined amount, the device is an extrinsic failure. If the second measured leakage current is below the second predetermined amount, the device a good device. The method provides a way to monitor gate oxide integrity and/or process stability using extrinsic measurements according to a specific embodiment. The method includes determining a breakdown voltage associated with the second measured leakage value. In a preferred embodiment, the second measured leakage current is characterized as extrinsic information and the breakdown voltage is characterized as intrinsic information.

13 Claims, 13 Drawing Sheets

U.S. PATENT DOCUMENTS

| | | |
|---|---|---|
| 6,927,591 B2 | 8/2005 | McCord |
| 7,127,690 B2 | 10/2006 | Gattiker et al. |
| 7,283,918 B2 * | 10/2007 | Nozuyama ............ 702/117 |
| 7,404,158 B2 * | 7/2008 | Nakajima ............ 716/4 |
| 2003/0076125 A1 | 4/2003 | McCord |
| 2005/0125711 A1 | 6/2005 | Gattiker et al. |
| 2006/0234401 A1 | 10/2006 | Slisher |
| 2007/0059850 A1 | 3/2007 | Zhao et al. |
| 2007/0059851 A1 | 3/2007 | Zhao et al. |

* cited by examiner

I-V curve comparison of the two lots

MULTIPLE POINT GATE OXIDE INTEGRITY TEST METHOD AND SYSTEM FOR THE MANUFACTURE OF SEMICONDUCTOR INTEGRATED CIRCUITS

CROSS-REFERENCES TO RELATED APPLICATIONS

This application claims the benefit and priority under 35 U.S.C. 119 (e) of U.S. Non-Provisional application Ser. No. 11/227,182, filed 14 Sep. 2005, entitled "Multiple Point Gate Oxide Integrity Test Method and System for the Manufacture of Semiconductor Integrated Circuits," which is now allowed, the contents of which are herein incorporated by reference in their entirety for all purposes.

The present application also incorporates by reference the commonly assigned U.S. Non-provisional application Ser. No. 11/227,012 in their entirety for all purposes.

BACKGROUND OF THE INVENTION

The present invention is directed to integrated circuits and their processing for the manufacture of semiconductor devices. More particularly, the invention provides a method and device for testing a gate oxide integrity for semiconductor integrated circuit devices, but it would be recognized that the invention has a much broader range of applicability.

Integrated circuits have evolved from a handful of interconnected devices fabricated on a single chip of silicon to millions of devices. Conventional integrated circuits provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of integrated circuits.

Increasing circuit density has not only improved the complexity and performance of integrated circuits but has also provided lower cost parts to the consumer. An integrated circuit or chip fabrication facility can cost hundreds of millions, or even billions, of U.S. dollars. Each fabrication facility will have a certain throughput of wafers, and each wafer will have a certain number of integrated circuits on it. Therefore, by making the individual devices of an integrated circuit smaller, more devices may be fabricated on each wafer, thus increasing the output of the fabrication facility. Making devices smaller is very challenging, as each process used in integrated fabrication has a limit. That is to say, a given process typically only works down to a certain feature size, and then either the process or the device layout needs to be changed. Additionally, as devices require faster and faster designs, process including testing limitations exist with certain conventional processes and testing procedures for wafer reliability.

An example of such test procedure is commonly called wafer level reliability testing, commonly called WLR. In particularly, WLR has been more and more popular in process control due to the lower overall cost and the shorter cycle time for process improvement. Among the many WLR test methods, the ramp tests (voltage as well as current) take much shorter time than the traditional methods, for example, time-dependent dielectric breakdown (TDDB) testing, and isothermal EM (Iso-EM) test for the FEOL (Front-End Of Line) and BEOL (Back-End Of Line) process, respectively. In conventional GOI (Gate Oxide Integrity) V-ramp tests, we stress ramp voltage to detect breakdown voltage (Vbd) and from the Vbd values, we divide the failures into various categories.

As the technology marches into the sub-90 nm era, the gate oxide becomes thinner (<12 Å) for MOS transistors, and the leakage current increases sharply. GOI testing becomes very difficult or even impossible. That is, larger structures cannot be used for testing. Additionally, smaller structures are often difficult to test efficiently and accurately. For accurate test results using smaller samples, increased test times must often occur. These and other limitations can be found throughout the present specification and more particularly below.

From the above, it is seen that an improved technique for processing semiconductor devices is desired.

SUMMARY OF INVENTION

According to the present invention, techniques directed to integrated circuits and their processing for the manufacture of semiconductor devices are provided. More particularly, the invention provides a method and device for testing a gate oxide integrity for semiconductor integrated circuit devices. More particularly, the invention provides a method and device for determining intrinsic characteristics of an MOS device using extrinsic measurements of one or more parameters. Although the invention has been described in terms of gate oxide integrity of MOS devices, it would be recognized that the invention has a much broader range of applicability.

In a specific embodiment, the present invention provides a method for manufacturing a semiconductor integrated circuit device, e.g., MOS transistor, CMOS transistors, bipolar. The method includes providing a semiconductor wafer free from patterns, e.g., bulk, silicon on insulator. The method includes processing the semiconductor wafer with one or more processes to form one more patterns thereon. The method includes applying an operating voltage on a gate of a test pattern device on the semiconductor wafer using one or more probing devices, which are coupled to a probing system. The method includes measuring a first leakage current associated with the operating voltage and determining if the measured first current is higher than a first predetermined amount. The method also includes categorizing the device as an initial failure if the measured first current is higher than the first predetermined amount. The method includes storing a first indication associated with the initial failure if the device has been categorized as the initial failure. The method includes applying a second voltage to the gate of the test pattern device of the semiconductor wafer if the measured first current is below the first predetermined amount. The method includes measuring a second leakage current associated with the second voltage using one or more probing devices. The method includes categorizing the device as an extrinsic failure if the second measured leakage current is higher than a second predetermined amount. The method includes storing a second indication associated with the extrinsic failure if the device has been categorized as the extrinsic failure and categorizing the device as a good device if the second measured leakage current is below the second predetermined amount. The method includes storing a third indication associated with the good device, if the device has been categorized as the good device.

In an alternative specific embodiment, the present invention provides a method for testing a semiconductor wafer using a multi-point probing process, which may be in-line or the like. The method includes providing a semiconductor wafer, including one more patterns thereon. The method includes applying an operating voltage on a gate of a test pattern device on the semiconductor wafer using one or more probing devices. The method includes measuring a first leakage current associated with the operating voltage. The method includes determining if the measured first current is higher than a first predetermined amount. The method also includes categorizing the device as an initial failure if the measured first current is higher than the first predetermined amount. The method stores a first indication associated with the initial failure if the device has been categorized as the initial failure. The method also includes applying a second voltage to the gate of the test pattern device of the semiconductor wafer if the measured first current is below the first predetermined amount. The method includes measuring a second leakage current associated with the second voltage using one or more probing devices. The method includes categorizing the device as an extrinsic failure if the second measured leakage current is higher than a second predetermined amount. The method also stores a second indication associated with the extrinsic failure if the device has been categorized as the extrinsic failure. The method includes categorizing the device as a good device if the second measured leakage current is below the second predetermined amount and storing a third indication associated with the good device, if the device has been categorized as the good device.

In yet an alternative embodiment, the present invention provides a system for testing a semiconductor wafer using an in-line process control. The system has one or more computer readable memories. The system includes one or more codes (e.g., computer codes) directed to applying an operating voltage on a gate of a test pattern on a semiconductor wafer using one or more probing devices. One or more codes is directed to measuring a first leakage current associated with the operating voltage. One or more codes is directed to determining if the measured first current is higher than a first predetermined amount to indicate an initial failure. One or more codes is directed to determining if the measured first current is below the first predetermined amount to indicate that the device is subjected to a second voltage. One or more codes is directed to applying the second voltage on the gate of the test pattern on the semiconductor wafer. One or more codes is directed to measuring a second leakage current associated with the second voltage. One or more codes is directed to determine if the second measured leakage current is higher than a second predetermined amount to indicate the device is an extrinsic failure. The system also includes one or more codes directed to determine if the second measured leakage current is below the second predetermined amount to indicate the device a good device.

Depending upon the specific embodiment, there can be other variations and modifications to any of the embodiments noted herein. In a preferred embodiment, the test pattern is associated with a gate oxide integrity test. In a specific embodiment, the test pattern comprises a plurality of electrodes formed overlying a gate dielectric layer, which is overlying an active region. The test pattern has a first predetermined length and a first predetermined width. In a preferred embodiment, the test pattern is provided on a scribe region of the semiconductor wafer. In one or more embodiments, the method includes determining a calculated breakdown voltage associated with the second measured current value using a plot of values represented by leakage current against breakdown voltage for at least two groupings of devices.

In a preferred embodiment, the present invention provides a method and system for multi-point (e.g., double-point) GOI test that can efficiently judge failure modes by testing only two points. We can measure leakage currents at only two voltages, which are the cut points of mode A-B and B-C, instead of the whole ramped voltages to save time and cost with the same test effectiveness according to a specific embodiment. By correlating leakage current at extrinsic field to the breakdown voltage, we can also evaluate the intrinsic reliability even if the samples are not subjected to actual breakdown according to a specific embodiment.

Many benefits are achieved by way of the present invention over conventional techniques. For example, the present technique provides an easy to use process that relies upon conventional technology. In some embodiments, the method provides a way to achieve higher device yields in dies per wafer. Additionally, the method provides a process that is compatible with conventional process technology without substantial modifications to conventional equipment and processes. In a specific embodiment, the present method and system can provide an easy way to test the integrity of gate oxide of one or more gate transistor devices provided on a test pattern. Alternatively, the present method and system can provide a way of determine intrinsic information using extrinsic test information according to a specific embodiment. In preferred embodiments, the present invention provides methods and systems that allow for determining a breakdown voltage of, for example, an MOS device using empirical information derived from test patterns using one or more probe structures. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

DETAILED DESCRIPTION OF SPECIFIC EMBODIMENTS

Figure 1:
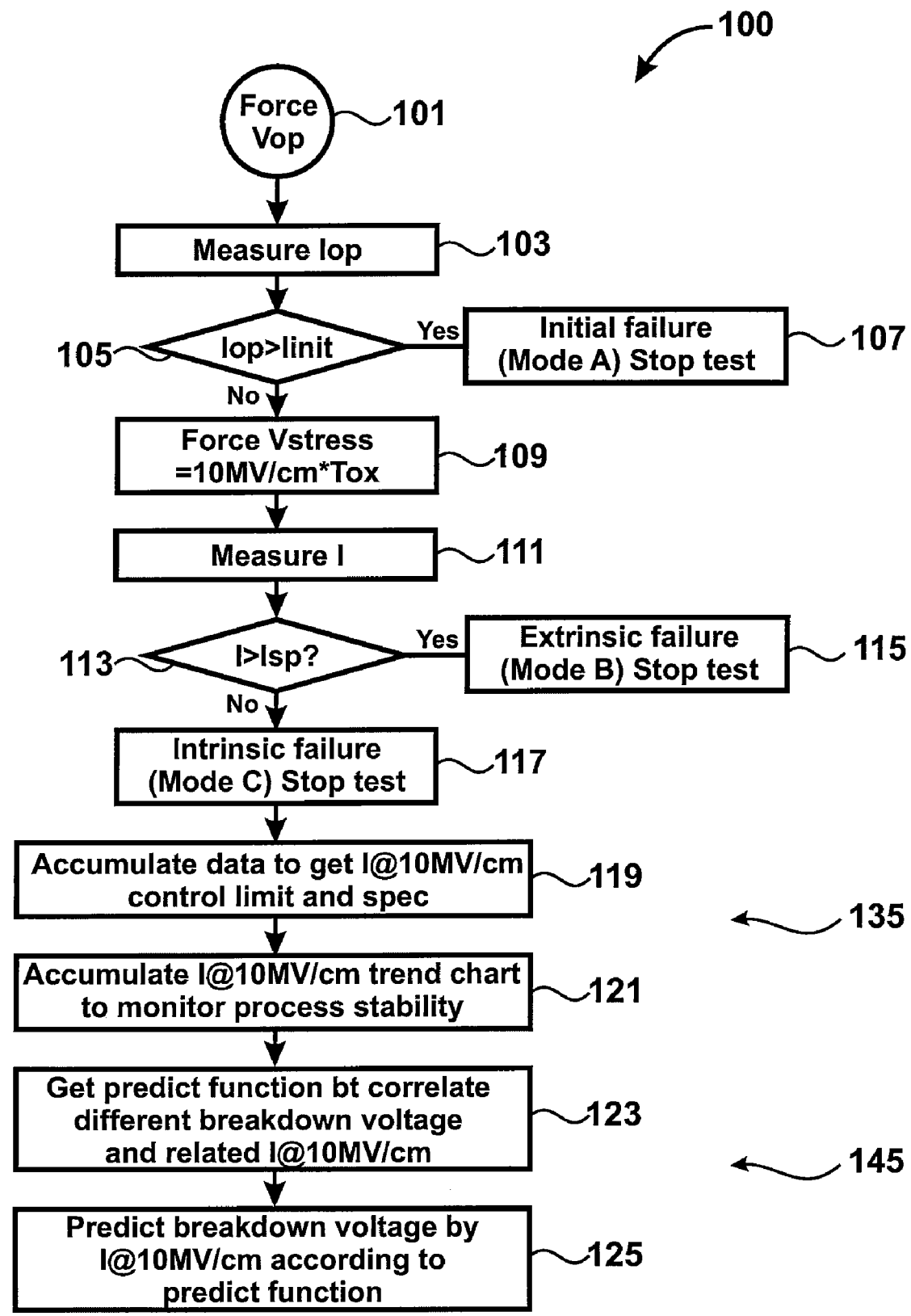
FIG. 1 is a simplified flow diagram of an overall testing method according to an embodiment of the present invention.

According to the present invention, techniques directed to integrated circuits and their processing for the manufacture of semiconductor devices are provided. More particularly, the invention provides a method and device for testing a gate oxide integrity for semiconductor integrated circuit devices. More particularly, the invention provides a method and device for determining intrinsic characteristics of an MOS device using extrinsic measurements of one or more parameters. Although the invention has been described in terms of gate oxide integrity of MOS devices, it would be recognized that the invention has a much broader range of applicability.

In a specific embodiment, a method for manufacturing a semiconductor device and categorizing one or more characteristics using a probing technique according to an alternative embodiment of the present invention may be outlined as follows.

1. Providing a semiconductor wafer with one more patterns thereon;
2. Apply an operating voltage on a gate of a test pattern device on the semiconductor wafer using one or more probing devices;
3. Measure a first leakage current associated with the operating voltage;
4. Determine if the measured first current is higher than a first predetermined amount;
5. Categorize the device as an initial failure if the measured first current is higher than the first predetermined amount;
6. Storing a first indication associated with the initial failure if the device has been categorized as the initial failure;
7. Apply a second voltage to the gate of the test pattern device of the semiconductor wafer if the measured first current is below the first predetermined amount;
8. Measure a second leakage current associated with the second voltage using one or more probing devices;
9. Categorize the device as an extrinsic failure if the second measured leakage current is higher than a second predetermined amount;
10. Store a second indication associated with the extrinsic failure if the device has been categorized as the extrinsic failure;
11. Categorize the device as a good device if the second measured leakage current is below the second predetermined amount;
12. Store a third indication associated with the good device, if the device has been categorized as the good device;
13. Determine if the second measure current value is within a predetermined range to indicate if one or more processes is stable;
14. Determine a breakdown voltage associated with the second measured current value;
15. Determine if the breakdown voltage is within a breakdown voltage predetermined value; and
16. Perform other steps, as desired.

The above sequence of steps provides a method according to an embodiment of the present invention. As shown, the method uses a combination of steps including a way of manufacturing and testing a semiconductor wafer for gate oxide integrity according to an embodiment of the present invention. Additionally, the method provides a way to monitor gate oxide integrity and/or process stability using extrinsic measurements according to a specific embodiment. In other embodiments, the present method and system provide for a way to determine an intrinsic characteristic (e.g., breakdown voltage) using one or more extrinsic characteristics, which are measurable, according to a specific embodiment. Other alternatives can also be provided where steps are added, one or more steps are removed, or one or more steps are provided in a different sequence without departing from the scope of the claims herein. Details of the present method and structure can be found throughout the present specification and more particularly below.

FIG. 1 is a simplified flow diagram of an overall testing method 100 according to an embodiment of the present invention. This diagram is merely an example, which should not unduly limit the scope of the claims herein. One of ordinary skill in the art would recognize other variations, modifications, and alternatives. In a specific embodiment, the method begins by providing a semiconductor wafer with one more patterns thereon. The semiconductor substrate often has one or more devices, including one or more patterned MOS transistors thereon. As merely an example, the semiconductor substrate can also be capable of being tested using the "Procedure for the Wafer-Level Testing of Thin Dielectrics," JEDEC Standard, JESD35-A published April 2001, which is hereby incorporated by reference herein, but can also be subjected to other testing techniques.

In a specific embodiment, the present method includes applying an operating voltage (step 101) on a gate of a test pattern device on the semiconductor wafer using one or more probing devices. In a specific embodiment, the probing devices can include those by Electroglas, Inc. of 5729 Fontanoso Way, San Jose, Calif. 95138-1015, as well as other companies, depending upon the application.

As further shown, the method measures (step 103) a first leakage current associated with the operating voltage. In a specific embodiment, the operating voltage can be any conventional operating voltage such as 3.3 volts, 2.5 volts, and others, depending upon the application. The method determines (step 105) if the measured first current is higher than a first predetermined amount. In a specific embodiment, the first predetermined amount is a limit provided by an operating specification. Depending upon the embodiment, the method categorizes the device as an initial failure (step 107) if the measured first current is higher than the first predetermined amount. Additionally, the method stores a first indication associated with the initial failure if the device has been categorized as the initial failure. Depending upon the embodiment, the first indication can be stored in one or more memories coupled to the wafer probing device.

In a specific embodiment, the method applies a second voltage (step 109) to the gate of the test pattern device of the semiconductor wafer if the measured first current is below the first predetermined amount. The method measures (step 111) a second leakage current associated with the second voltage using one or more probing devices according to a specific embodiment. As shown, the method categorizes (step 115) the device as an extrinsic failure if (step 113) the second measured leakage current is higher than a second predetermined amount, which is an amount determined by an operating specification. The method stores a second indication associated with the extrinsic failure if the device has been categorized as the extrinsic failure according to a specific embodiment. Depending upon the embodiment, the second indication can be stored in one or more memories coupled to the wafer probing device.

In a specific embodiment, the method categorizes (step 117) the device as a good device if the second measured leakage current is below the second predetermined amount. In a specific embodiment, the method store a third indication associated with the good device, if the device has been categorized as the good device. Depending upon the embodiment, the third indication can be stored in one or more memories coupled to the wafer probing device. As also shown, the method can stop, step 117, if it is determined that the device has an intrinsic failure. Further details of the present method can be found throughout the present specification and more particularly below. Of course, there can be other modifications, alternatives, and variations.

In an alternative embodiment, the method accumulates (step 119) information (e.g., data) to form a control limit for a specification. In a preferred embodiment, the method determines current at a certain voltage, which is applied, to the MOS device. The method determines such data for a plurality of devices to obtain the control limit. The method determines, as an example, if the second measure current value is within a predetermined range to indicate if one or more processes is stable (step 121), using the control limit and empirical data according to a specific embodiment. Further details of the present method can be found throughout the present specification and more particularly below. Of course, there can be other modifications, alternatives, and variations.

In an alternative specific embodiment, the method forms a predictive relationship (step 123) by associating different breakdown voltages and related current and voltage data. In a preferred embodiment, the present method determines intrinsic device information such as breakdown voltage using extrinsic current/voltage data. Once the predictive relationship has been established, the method determines a breakdown voltage associated with the second measured current value according to a specific embodiment. The method determines if the breakdown voltage is within a breakdown voltage predetermined value, step 125, using the predictive relationship. Further details of the present method can be found throughout the present specification and more particularly below. Of course, there can be other modifications, alternatives, and variations.

The above sequence of steps provides a method according to an embodiment of the present invention. As shown, the method uses a combination of steps including a way of manufacturing and testing a semiconductor wafer for gate oxide integrity according to an embodiment of the present invention. Additionally, the method provides a way to monitor gate oxide integrity and/or process stability using extrinsic measurements according to a specific embodiment. In other embodiments, the present method and system provide for a way to determine an intrinsic characteristic (e.g., breakdown voltage) using one or more extrinsic characteristics, which are measurable, according to a specific embodiment. Other alternatives can also be provided where steps are added, one or more steps are removed, or one or more steps are provided in a different sequence without departing from the scope of the claims herein.

Figure 2:
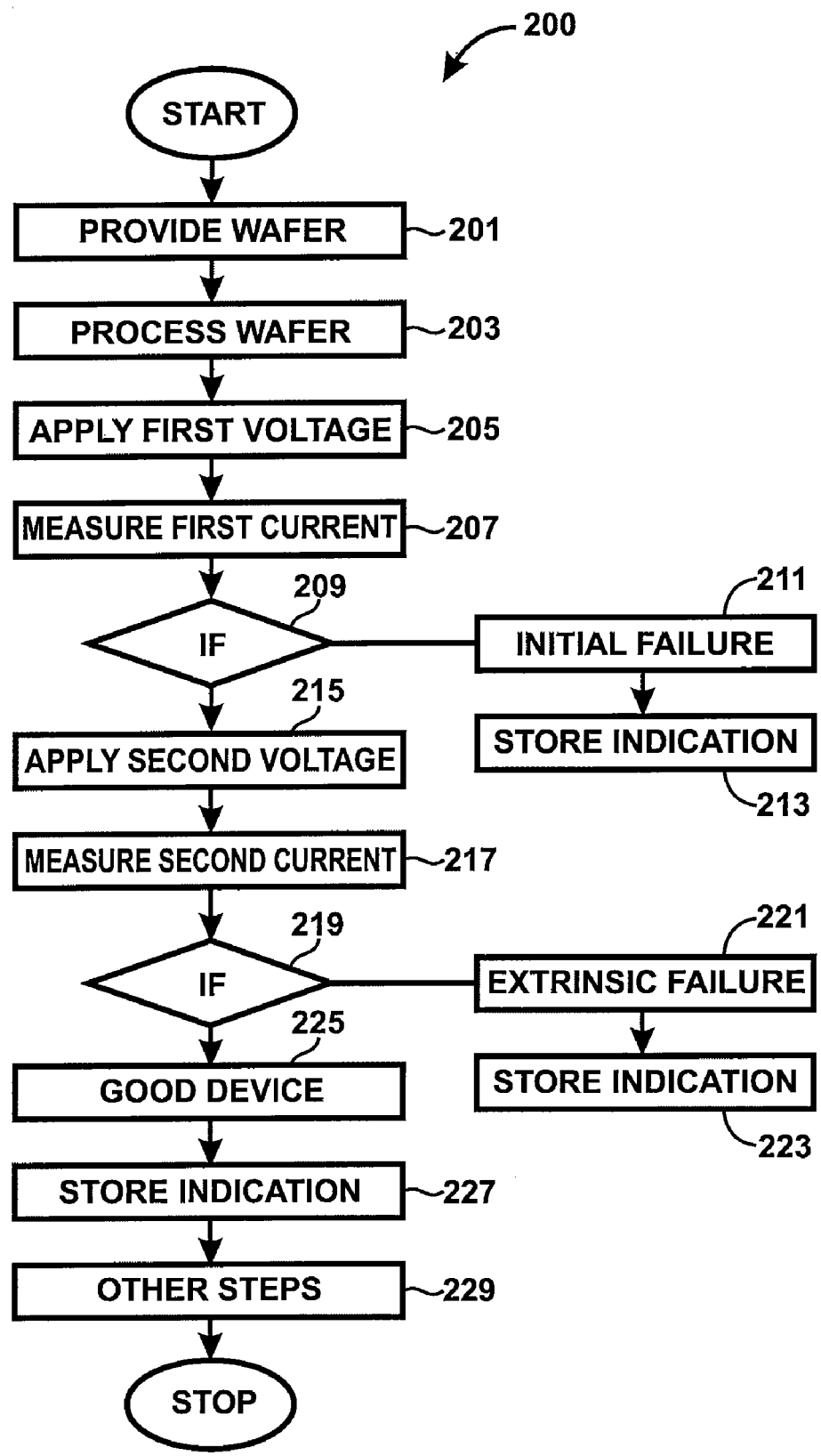
FIG. 2 is a simplified flow diagram of an alternative testing method according to an alternative embodiment of the present invention.

In a specific embodiment, a method for manufacturing a semiconductor device and categorizing one or more characteristics using a probing technique according to an alternative embodiment of the present invention may be outlined as follows and referenced by a simplified flow diagram 200 of FIG. 2.

1. Provide (step 201) a semiconductor wafer free from patterns;
2. Process (step 203) the semiconductor wafer with one or more processes to form one more patterns thereon;
3. Apply (step 205) an operating voltage on a gate of a test pattern device on the semiconductor wafer using one or more probing devices;
4. Measure (step 207) a first leakage current associated with the operating voltage;
5. Determine (step 209) if the measured first current is higher than a first predetermined amount;
6. Categorize the device as an initial failure (step 211) if the measured first current is higher than the first predetermined amount;
7. Storing a first indication (step 213) associated with the initial failure if the device has been categorized as the initial failure;
8. Apply (step 215) a second voltage to the gate of the test pattern device of the semiconductor wafer if the measured first current is below the first predetermined amount;
9. Measure a second leakage current (step 217) associated with the second voltage using one or more probing devices;
10. Categorize the device as an extrinsic failure (step 221) if the second measured leakage current is higher than a second predetermined amount;
11. Store a second indication (step 223) associated with the extrinsic failure if the device has been categorized as the extrinsic failure;
12. Categorize the device as a good device (step 225) if the second measured leakage current is below the second predetermined amount;
13. Store a third indication (step 227) associated with the good device, if the device has been categorized as the good device; and
14. Perform other steps (step 229), as desired.

The above sequence of steps provides a method according to an embodiment of the present invention. As shown, the method uses a combination of steps including a way of manufacturing and testing a semiconductor wafer for gate oxide integrity according to an embodiment of the present invention. Other alternatives can also be provided where steps are added, one or more steps are removed, or one or more steps are provided in a different sequence without departing from the scope of the claims herein. As shown, FIG. 2 is the simplified flow diagram 200 of the alternative testing method according to the alternative embodiment of the present invention. This diagram is merely an example, which should not unduly limit the scope of the claims herein. One of ordinary skill in the art would recognize other variations, modifications, and alternatives. Details of the present method and structure can be found throughout the present specification and more particularly below.

Figure 3:
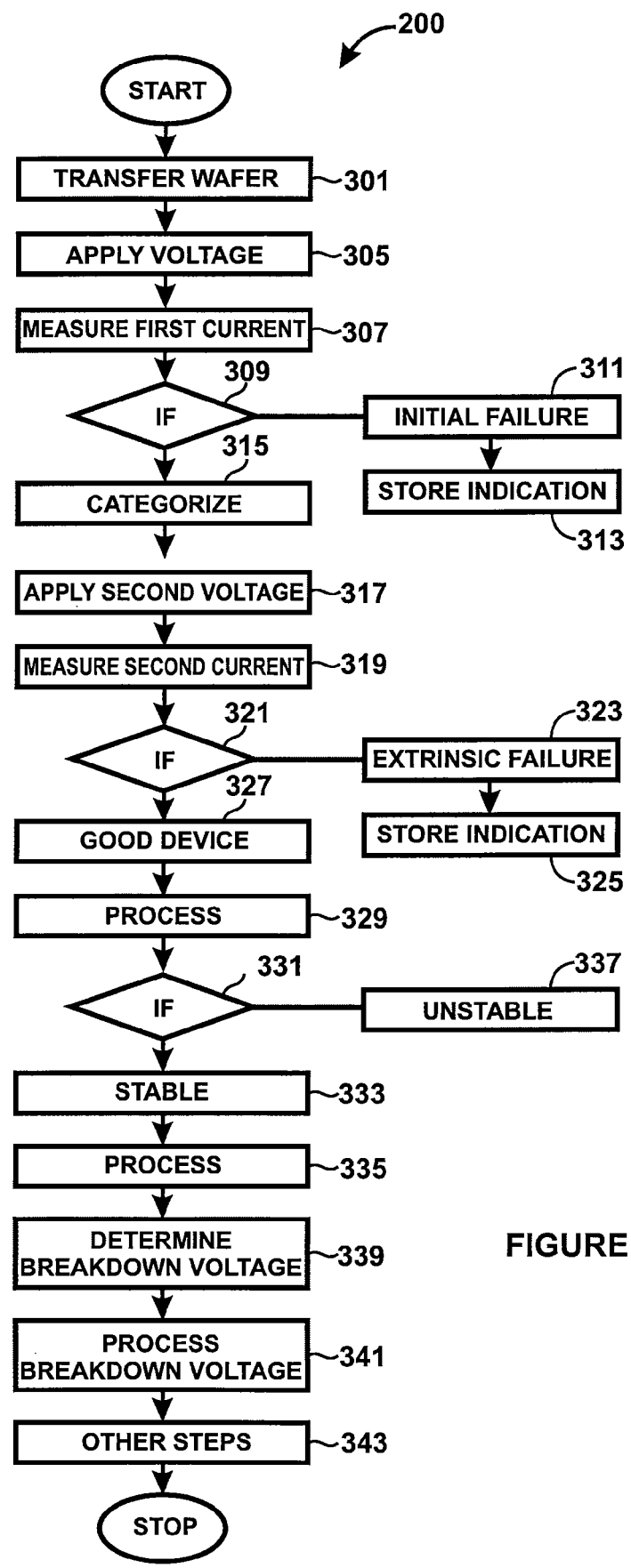
FIG. 3 is a simplified flow diagram of yet an alternative testing method according to an alternative embodiment of the present invention.

In an alternative specific embodiment, the present invention provides a method for manufacturing one or more semiconductor wafers using an in-line process control, which has been briefly outlined below and referenced by a simplified flow diagram 300 of FIG. 3.

1. Transfer (step 301) an in-process semiconductor wafer to a test station;
2. Apply (step 305) an operating voltage on a gate of a test pattern with an associated device on a semiconductor wafer using one or more probing devices;
3. Measure a first leakage current (step 307) associated with the operating voltage;
4. If (step 309) the measured first current is higher than a first predetermined amount, categorize the device as an initial failure (step 311) and store indication associated with the initial failure (step 313);
5. If the measured first current is below the first predetermined amount, categorize (step 315) the device for a second voltage test process;
6. Apply (step 317) the second voltage using the second voltage test process on the gate of the test pattern on the semiconductor wafer;
7. Measure (step 319) a second leakage current associated with the second voltage;
8. If (step 321) the second measured leakage current is higher than a second predetermined amount, categorize the device as an extrinsic failure (step 323) and store indication associated with the extrinsic failure (step 325);
9. If the second measured leakage current is below the second predetermined amount, categorize the device as a good device (step 327);
10. Process (step 329) the second measure current value within a predetermined range formed using data from current/voltage measurements;
11. Determine if (step 331) the second measure current value is within the predetermined range to indicate if one or more processes is stable (step 333);
12. Determine if (step 331) the second measure current value is within the predetermined range to indicate if one or more processes is unstable (step 337);

13. Process (step 335) the second measured current value against current/voltage measurements to determine a breakdown voltage;

14. Determine the breakdown voltage (step 339) associated with the second measured current value;

15. Determine if the breakdown voltage is within a breakdown voltage predetermined value (step 341); and 16. Perform other steps (step 343), as desired.

The above sequence of steps provides a method according to an embodiment of the present invention. As shown, the method uses a combination of steps including a way of manufacturing and testing a semiconductor wafer for gate oxide integrity according to an embodiment of the present invention. As shown, the method also provides a way of determining a breakdown voltage using a current value according to an embodiment of the present invention. Other alternatives can also be provided where steps are added, one or more steps are removed, or one or more steps are provided in a different sequence without departing from the scope of the claims herein. Details of the present method and structure can be found throughout the present specification and more particularly below. As shown, FIG. 3 is the simplified flow diagram 300 of yet the alternative testing method according to an alternative embodiment of the present invention. This diagram is merely an example, which should not unduly limit the scope of the claims herein. One of ordinary skill in the art would recognize other variations, modifications, and alternatives. Further details of the present invention can be found throughout the present specification and more particularly below.

Figure 4:
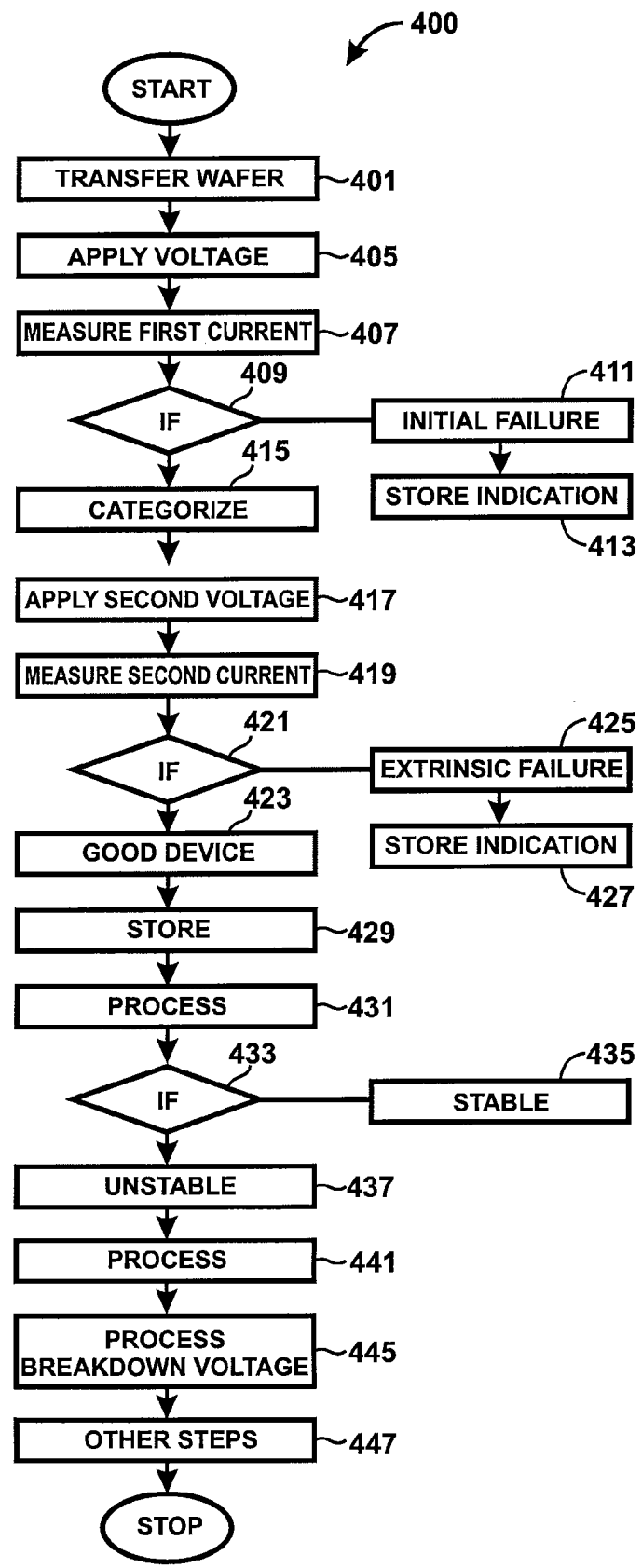
FIG. 4 is a simplified flow diagram of still an alternative testing method according to an embodiment of the present invention.

In an alternative specific embodiment, the present invention provides a method for manufacturing one or more semiconductor wafers using an in-line process control, which has been briefly outlined below and referenced by a simplified flow diagram 400 of FIG. 4.

1. Transfer (step 401) an in-process semiconductor wafer to a test station;

2. Apply (step 405) an operating voltage on a gate of a test pattern with an associated device on a semiconductor wafer using one or more probing devices;

3. Measure (step 407) a first leakage current associated with the operating voltage;

4. If (step 409) the measured first current is higher than a first predetermined amount, categorize the device as an initial failure (step 411) and stores an indication associated with the initial failure (step 413);

5. If the measured first current is below the first predetermined amount, categorize (step 415) the device for a second voltage test process;

6. Apply (step 417) the second voltage using the second voltage test process on the gate of the test pattern on the semiconductor wafer;

7. Measure (step 419) a second leakage current associated with the second voltage;

8. If (step 421) the second measured leakage current is higher than a second predetermined amount, categorize the device as an extrinsic failure (step 425) and store an indication associated with the extrinsic failure (step 427);

9. If the second measured leakage current is below the second predetermined amount, categorize the device as a good device (step 423) and store (step 429) an indication associated with the good device;

10. Determine if (steps 431, 433) the second measure current value is within a predetermined range to indicate if one or more processes is stable (step 435) or unstable (step 437);

11. Determine (step 441, 445) a breakdown voltage associated with the second measured current value;

12. Determine (step 445) if the breakdown voltage is within a breakdown voltage predetermined value; and 13. Perform other steps (step 447), as desired.

The above sequence of steps provides a method according to an embodiment of the present invention. As shown, the method uses a combination of steps including a way of manufacturing and testing a semiconductor wafer for gate oxide integrity according to an embodiment of the present invention. As shown, the method also provides a way of determining a breakdown voltage using a current value according to an embodiment of the present invention. Other alternatives can also be provided where steps are added, one or more steps are removed, or one or more steps are provided in a different sequence without departing from the scope of the claims herein. As shown, FIG. 4 is the simplified flow diagram of still the alternative testing method according to the embodiment of the present invention. This diagram is merely an example, which should not unduly limit the scope of the claims herein. One of ordinary skill in the art would recognize other variations, modifications, and alternatives. Details of the present method and structure can be found throughout the present specification and more particularly below.

Figure 5:
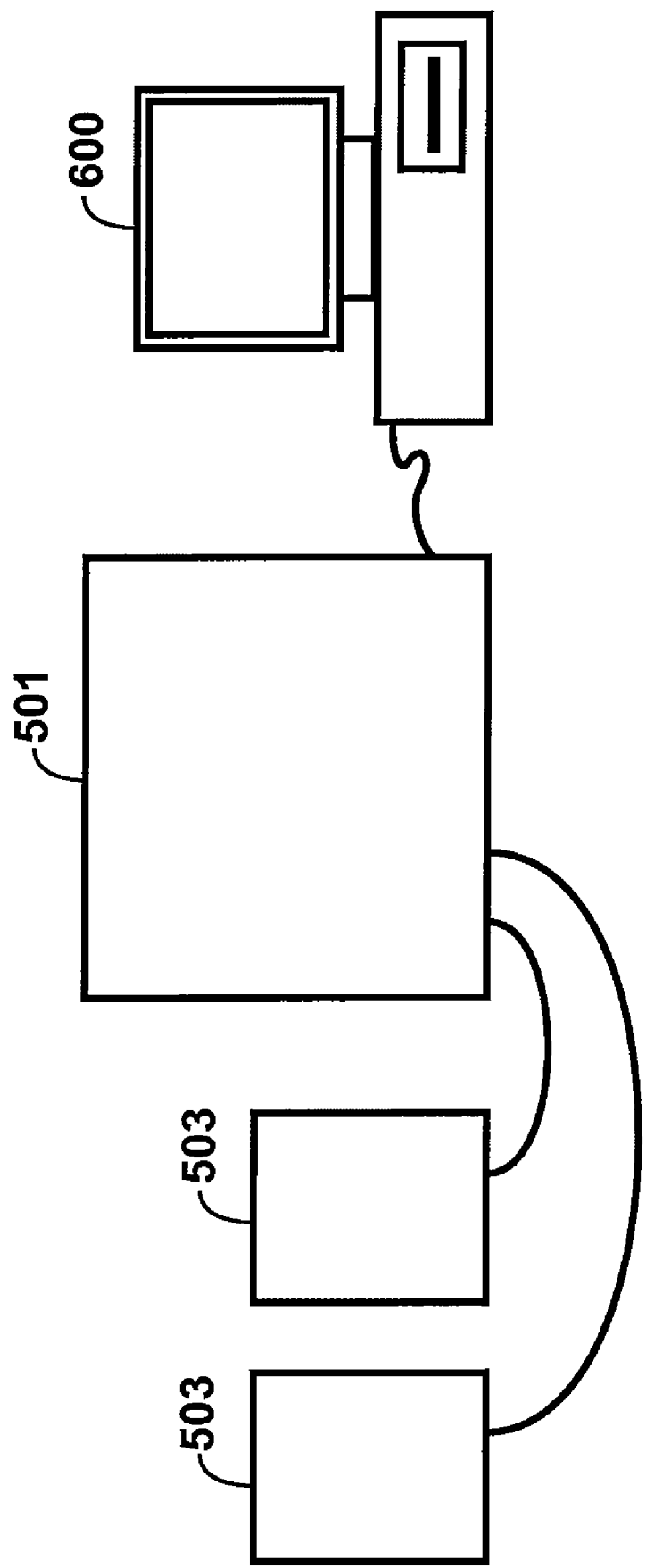
FIG. 5 is a simplified diagram of a testing system according to an embodiment of the present invention.

FIG. 5 is a simplified diagram of a testing system 500 according to an embodiment of the present invention. This diagram is merely an example, which should not unduly limit the scope of the claims herein. One of ordinary skill in the art would recognize other variations, modifications, and alternatives. As shown, the test system includes a tester 501 coupled to a probing unit 503 or one or more probing units. Each of the probing units includes test head 505 and other elements. Examples of such probing units are provided by Electroglas, Inc. of 5729 Fontanoso Way, San Jose, Calif. 95138-1015, as well as other companies, depending upon the application. The tester and probing unit are often overseen and controlled by one or more computer systems. Of course, there can be other variations, modifications, and alternatives. Details of these computing systems can be found throughout the present specification and more particularly below.

Figure 6:
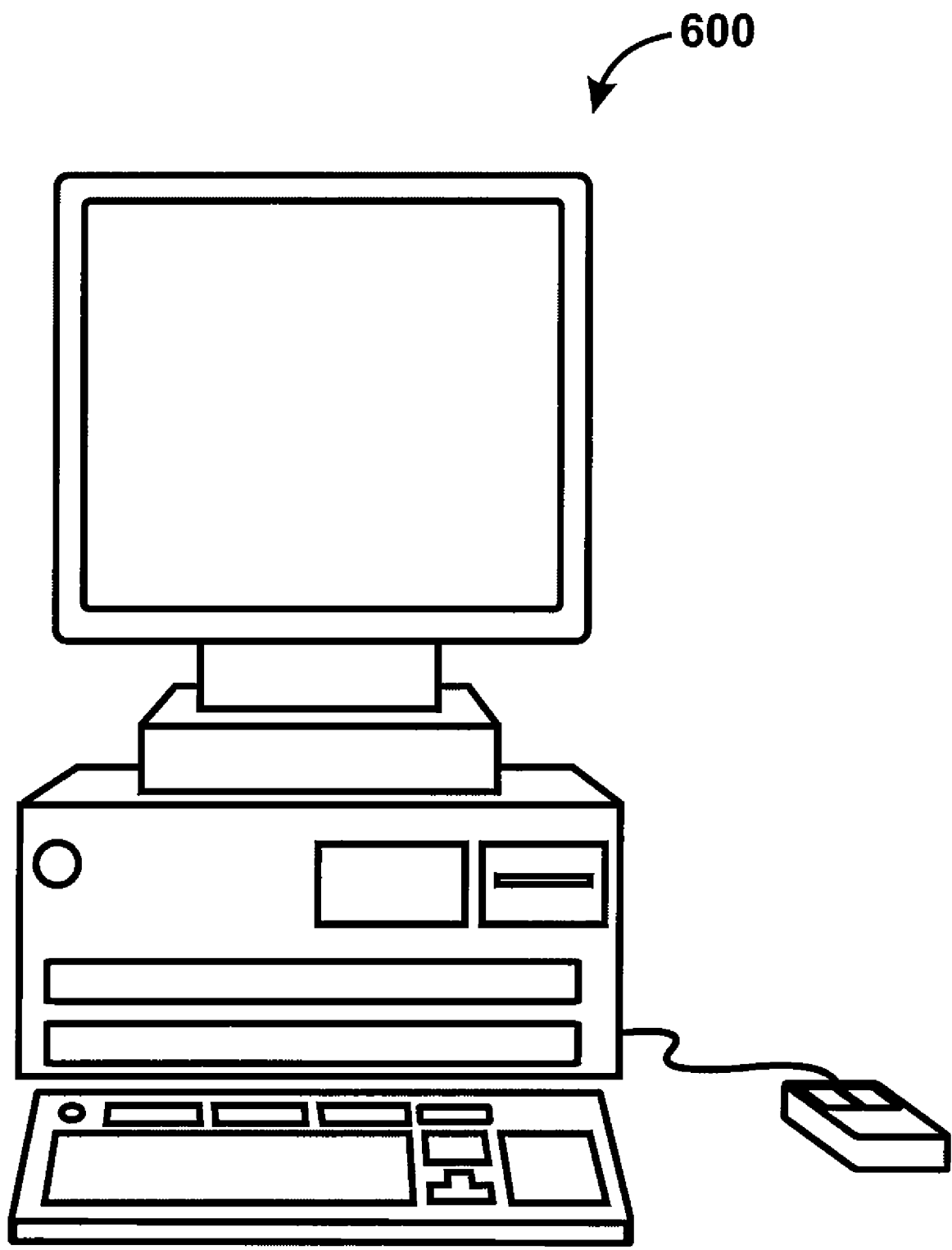
FIGS. 6 and 6A are simplified diagrams of a computer system according to an embodiment of the present invention.
Figure 6A:
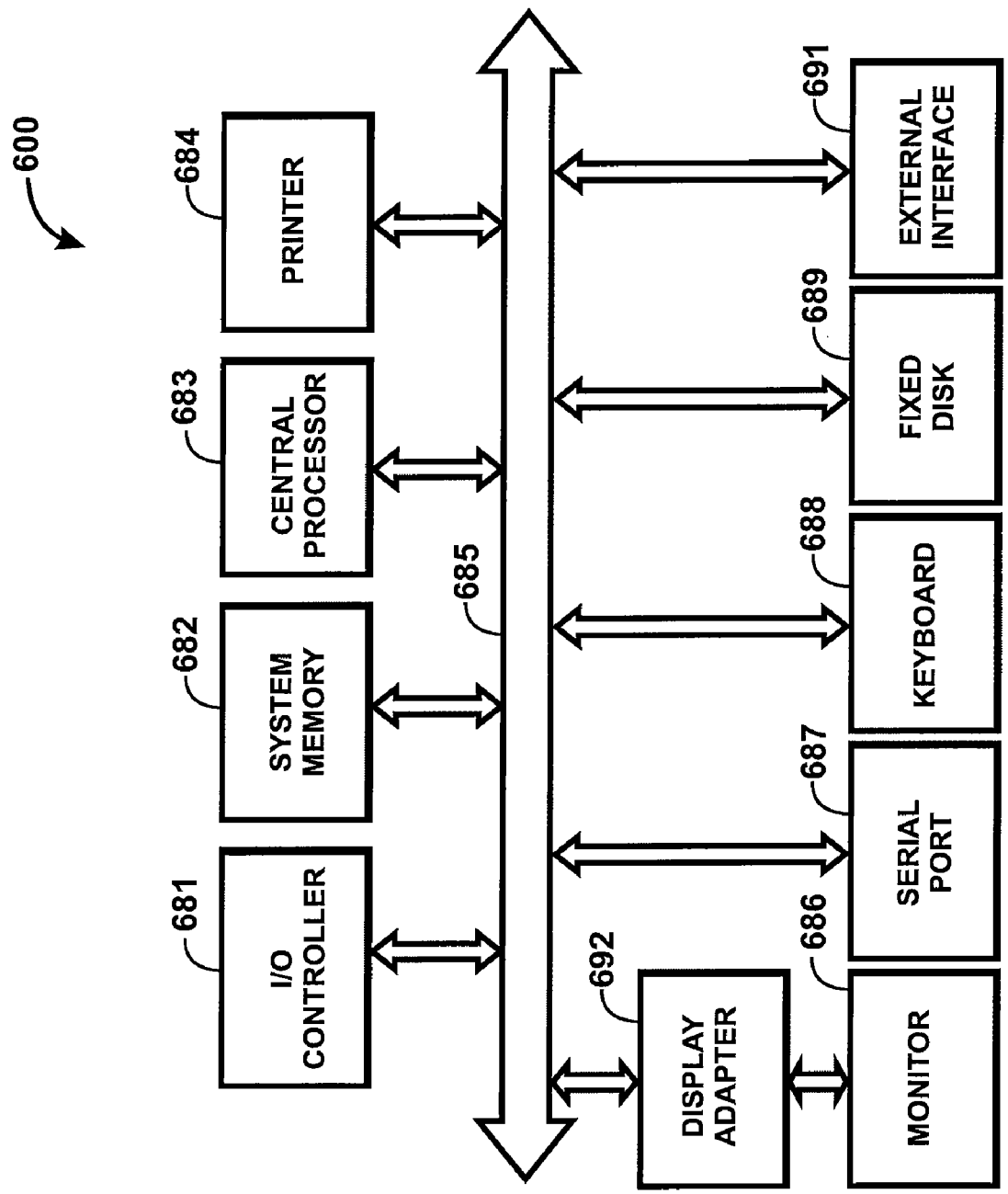

FIGS. 6 and 6A are simplified diagrams of a computer system 600, which couples to test system, according to an embodiment of the present invention. These diagrams are merely examples, which should not unduly limit the scope of the claims herein. One of ordinary skill in the art would recognize other variations, modifications, and alternatives. Depending upon the specific embodiment, the computer system includes a microprocessor and/controllers. In a preferred embodiment, the computer system or systems include a common bus, oversees and performs operation and processing of information. As shown, the computer system includes display device, display screen, cabinet, keyboard, scanner and mouse. Mouse and keyboard are representative "user input devices." Mouse includes buttons for selection of buttons on a graphical user interface device. Other examples of user input devices are a touch screen, light pen, track ball, data glove, microphone, and so forth.

The system is merely representative of but one type of system for embodying the present invention. It will be readily apparent to one of ordinary skill in the art that many system types and configurations are suitable for use in conjunction with the present invention. In a preferred embodiment, computer system includes a Pentium™ class based computer, running Windows™ NT operating system by Microsoft Corporation or Linux based systems from a variety of sources. However, the system is easily adapted to other operating systems and architectures by those of ordinary skill in the art without departing from the scope of the present invention. As noted, mouse can have one or more buttons such as buttons.

Cabinet houses familiar computer components such as disk drives, a processor, storage device, etc. Storage devices include, but are not limited to, disk drives, magnetic tape, solid-state memory, bubble memory, etc. Cabinet can include additional hardware such as input/output (I/O) interface cards for connecting computer system to external devices external storage, other computers or additional peripherals, which are further described below.

FIG. 6A is a more detailed diagram of hardware elements in the computer system according to an embodiment of the present invention. This diagram is merely an example, which should not unduly limit the scope of the claims herein. One of ordinary skill in the art would recognize many other modifications, alternatives, and variations. As shown, basic subsystems are included in computer system 600. In specific embodiments, the subsystems are interconnected via a system bus 385. Additional subsystems such as a printer 684, keyboard 688, fixed disk 689, monitor 686, which is coupled to display adapter 692, and others are shown. Peripherals and input/output (I/O) devices, which couple to I/O controller 681, can be connected to the computer system by any number of means known in the art, such as serial port 687. For example, serial port 687 can be used to connect the computer system to a modem 691, which in turn connects to a wide area network such as the Internet, a mouse input device, or a scanner. The interconnection via system bus allows central processor 683 to communicate with each subsystem and to control the execution of instructions from system memory 682 or the fixed disk 689, as well as the exchange of information between subsystems. Other arrangements of subsystems and interconnections are readily achievable by those of ordinary skill in the art. System memory, and the fixed disk are examples of tangible media for storage of computer programs, other types of tangible media include floppy disks, removable hard disks, optical storage media such as CD-ROMS and bar codes, and semiconductor memories such as flash memory, read-only-memories (ROM), and battery backed memory.

Although the above has been illustrated in terms of specific hardware features, it would be recognized that many variations, alternatives, and modifications can exist. For example, any of the hardware features can be further combined, or even separated. The features can also be implemented, in part, through software or a combination of hardware and software. The hardware and software can be further integrated or less integrated depending upon the application. Further details of certain methods according to the present invention can be found throughout the present specification and more particularly below.

EXAMPLES

FIGS. 7 through 13 are simplified diagrams of certain experimental results according to embodiments of the present invention. These diagrams are merely examples, which should not unduly limit the scope of the claims herein. One of ordinary skill in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Among the many WLR test methods, the ramp tests (voltage as well as current) take much shorter time than the traditional methods [1,2]; we propose the double-point GOI V-ramp (voltage ramp) further reduce test time for WLRC.

Figure 7:
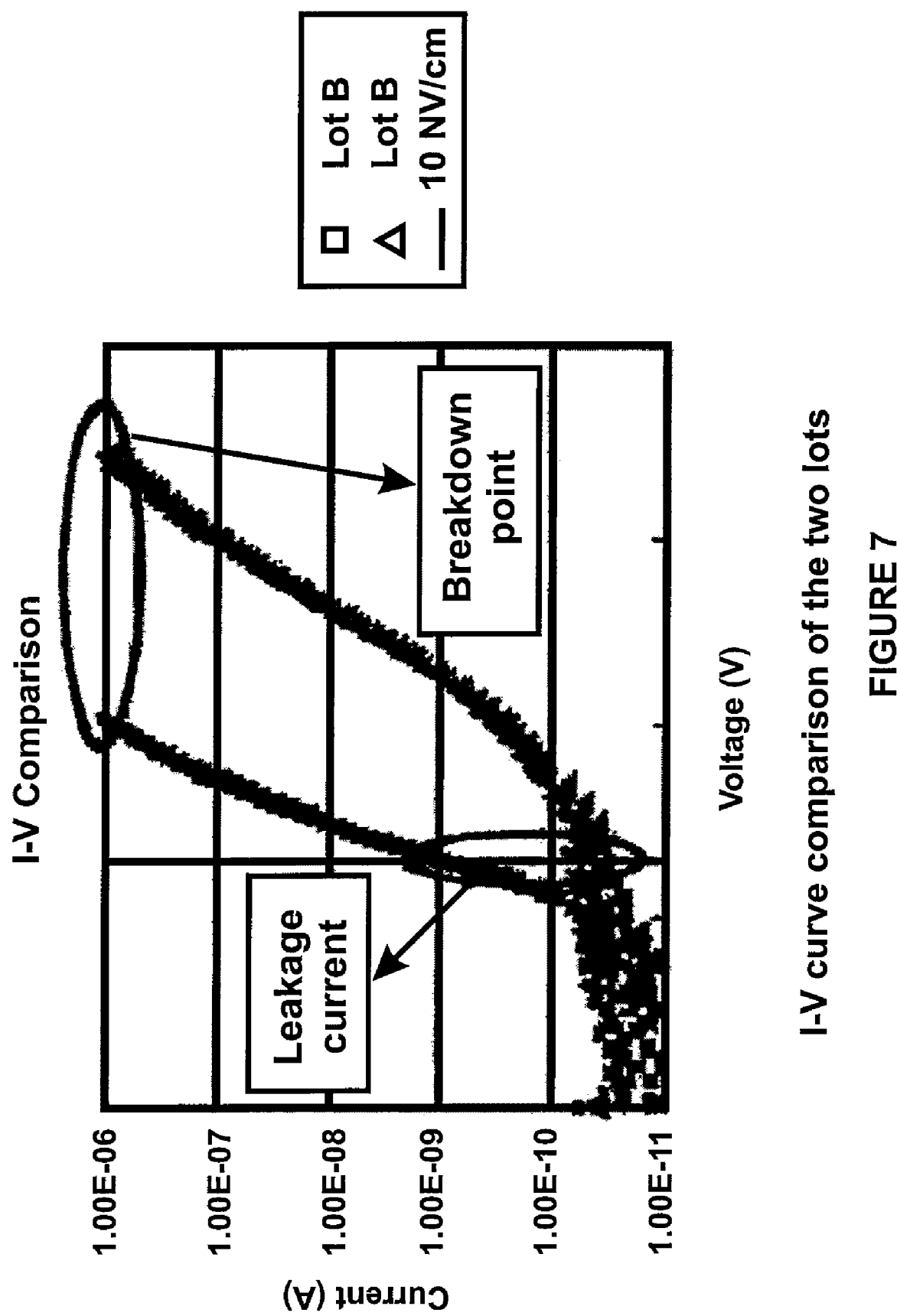
FIGS. 7 through 13 are simplified diagrams of certain experimental results according to embodiments of the present invention.
Figure 8:
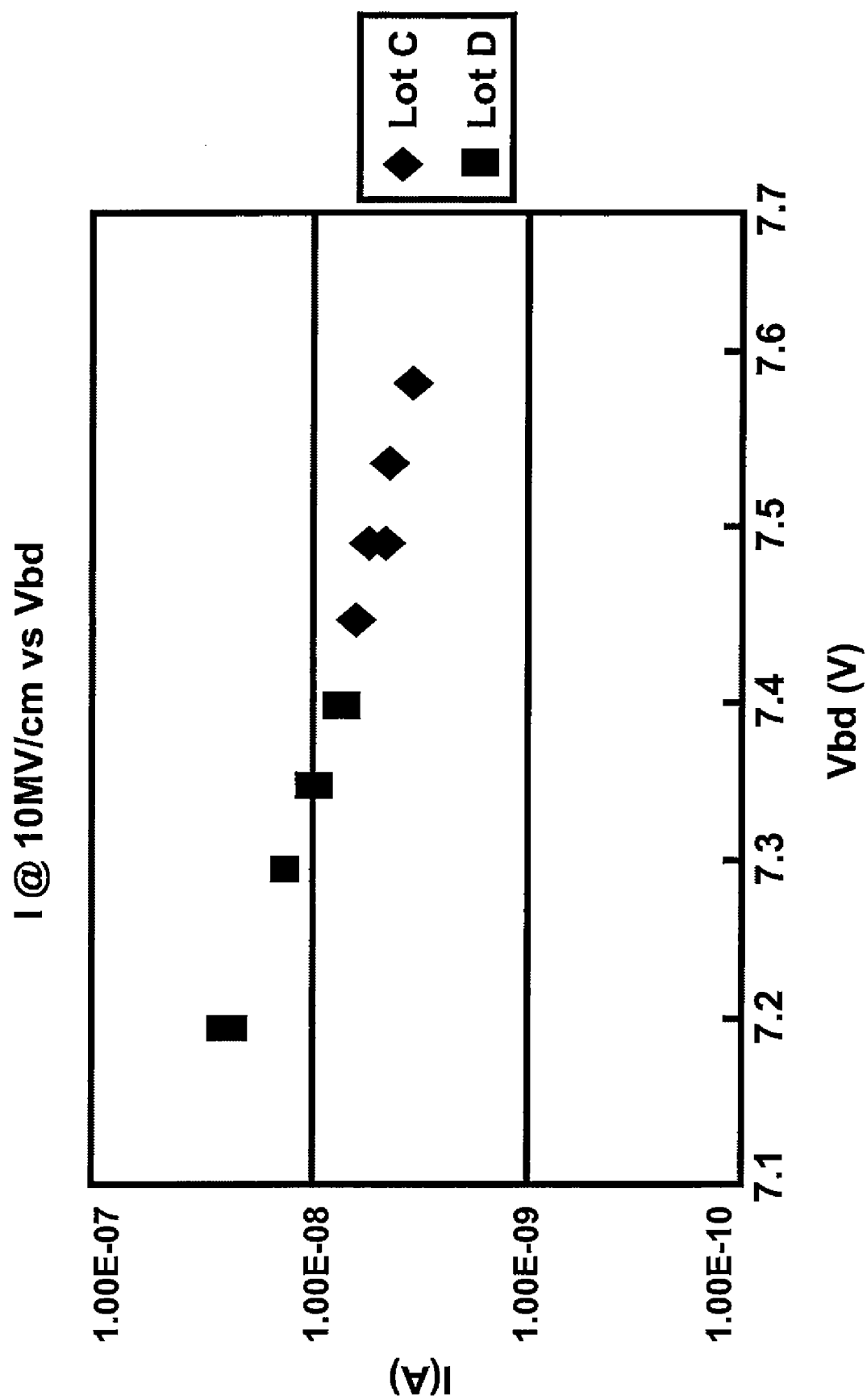

In the fast WLR GOI tests, we can measure leakage currents at only two voltages, which are the cut points of mode A-B and B-C [3], instead of the whole ramped voltages to save time/cost with the same test effectiveness. FIG. 7 shows the typical I-V curves from two lots: Lot B suffers in-line problems and has a lower breakdown voltage than Lot A, which is normal.

From the I-V curves, we notice Lot B has a higher leakage current at 10 MV/cm (which is gate oxide V-ramp test criteria for mode B in this case). This indicates that the leakage currents at certain voltage are related to the breakdown voltage. We can conclude that a higher current will lead to a lower breakdown voltage. This indicates a good correlation between extrinsic and intrinsic reliability. So we can use the operation voltage and 10 MV/cm as the test point to judge mode A and B failure, respectively. We can also use the current under 10 MV/cm to project the intrinsic lifetime. This method is more sensitive on samples with small areas due to the lower leakage levels; thus, it is more suitable for WLRC test. This test can save 70% testing time than the conventional V-ramp tests Referring back to FIG. 7, we illustrated the typical I-V from two lots: Lot B suffers in-line problems and has a lower breakdown voltage than Lot A, which is normal. From the I-V curves, we notice Lot B has a higher leakage current at 10 MV/cm (which is gate oxide V-ramp test criteria for mode B in this case). This indicates that the leakage currents at certain voltage are related to the breakdown voltage, which is confirmed by FIG. 8. We can conclude that a higher current will lead to a lower breakdown voltage. This indicates a good correlation between extrinsic and intrinsic reliability. So we can use the operation voltage and 10 MV/cm as the test point to judge mode A and B failure, respectively.

Figure 9:
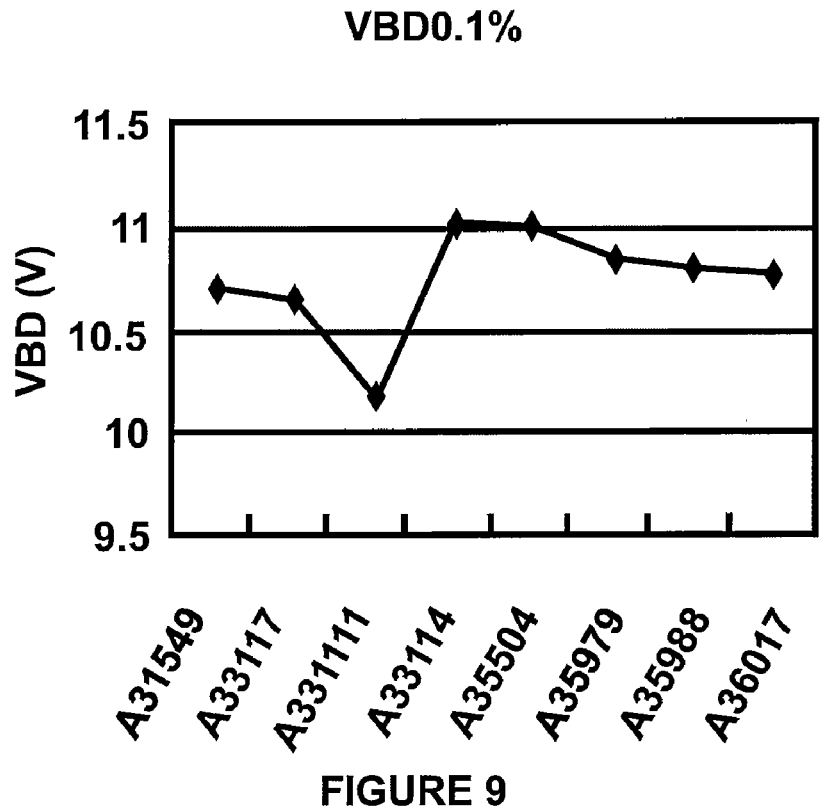
Figure 10:
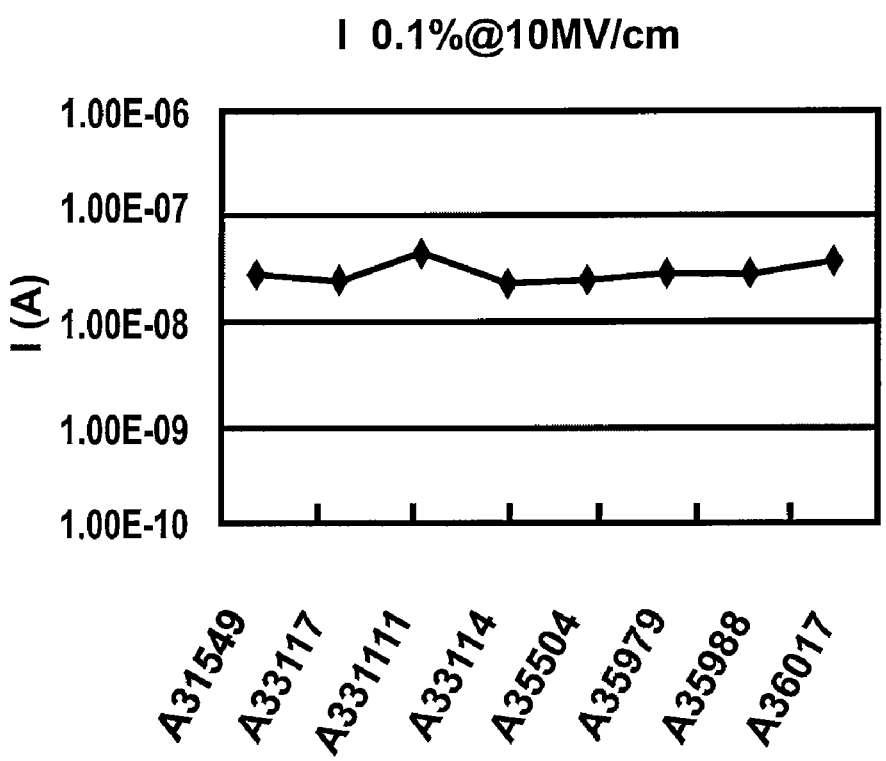
Figure 11:
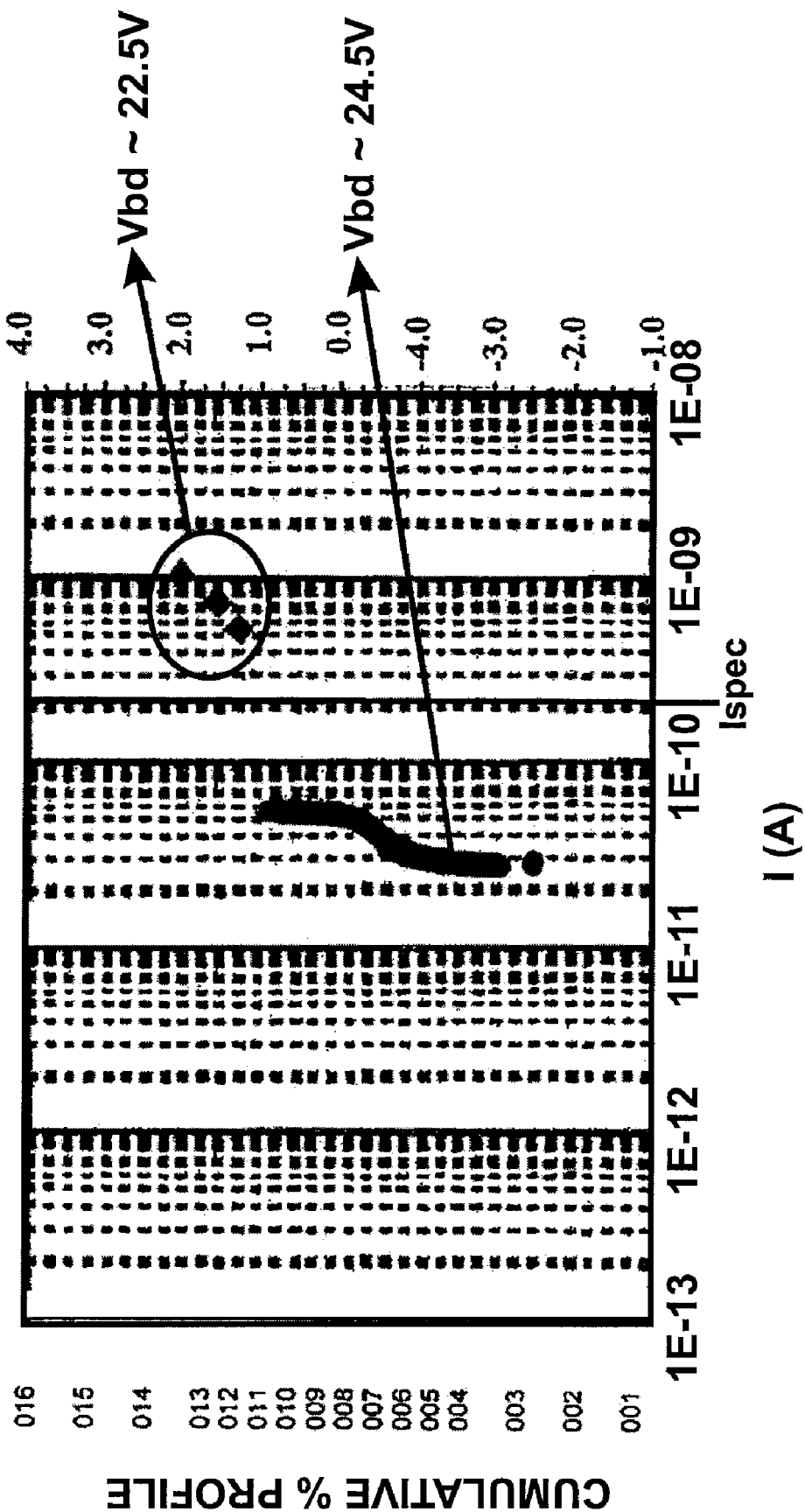
Figure 12:
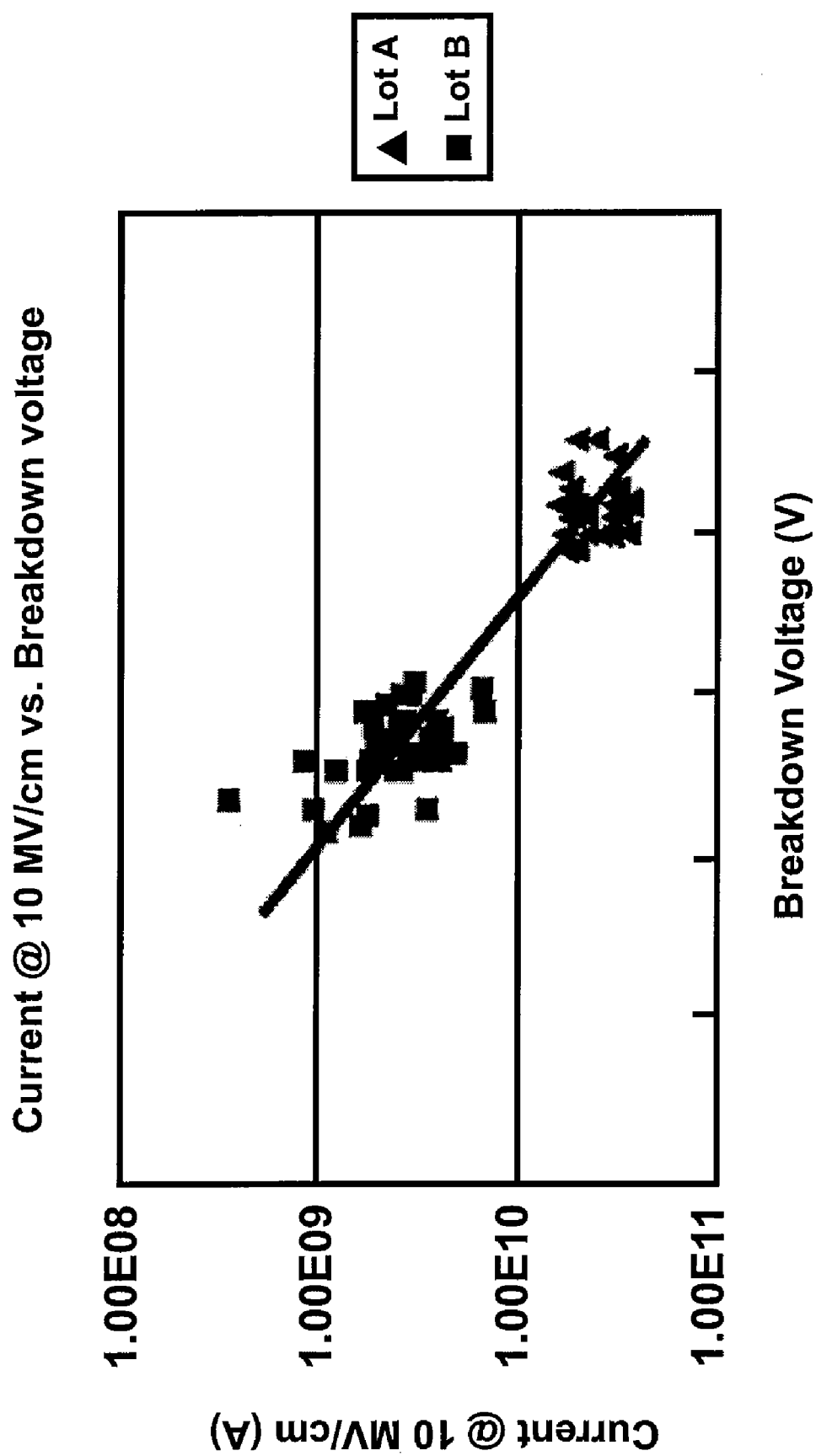

In a specific embodiment, the present method is more sensitive on samples with small areas due to the lower leakage levels; thus, it is more suitable for WLRC test (scribe lane test structure, for example: 100*70 um2). Referring now to FIG. 9, which illustrates a Vbd 0.1% WLRC trend chart and FIG. 10 is an 10.1%@10 MV/cm trend chart according to a specific embodiment. Referring to these figures, we can find they have very good consistence. From FIG. 11, we can find that the present double-point method is very sensitive even for intrinsic oxide performance. Vbd has a difference of only several volts, but I@10 MV/cm has several tenfold difference. By the present double-point GOI test method, we can save 70% test time than the conventional V-ramp tests according to a specific embodiment. Of course, there can be other variations, modifications, and alternatives.

We can also use the current under 10 MV/cm to project the intrinsic performance of the device. As FIG. 12 indicates, we can get fit function from real data for a given process and project breakdown voltage according to the current under 10 MV/cm. So, by correlating leakage current at extrinsic field to the breakdown voltage, we can also evaluate the intrinsic reliability even if the device samples are not subjected to actual breakdown. We can explain this correlation between leakage current at extrinsic field and the breakdown voltage from tunneling current and effective oxide thinning by the following relationships.

Tunneling Current:

$$J = A^*(Eox)^{2*}\exp(-B/Eox) \qquad \text{Equation (1)}$$

where: Eox is the oxide electrical field.

Figure 13:
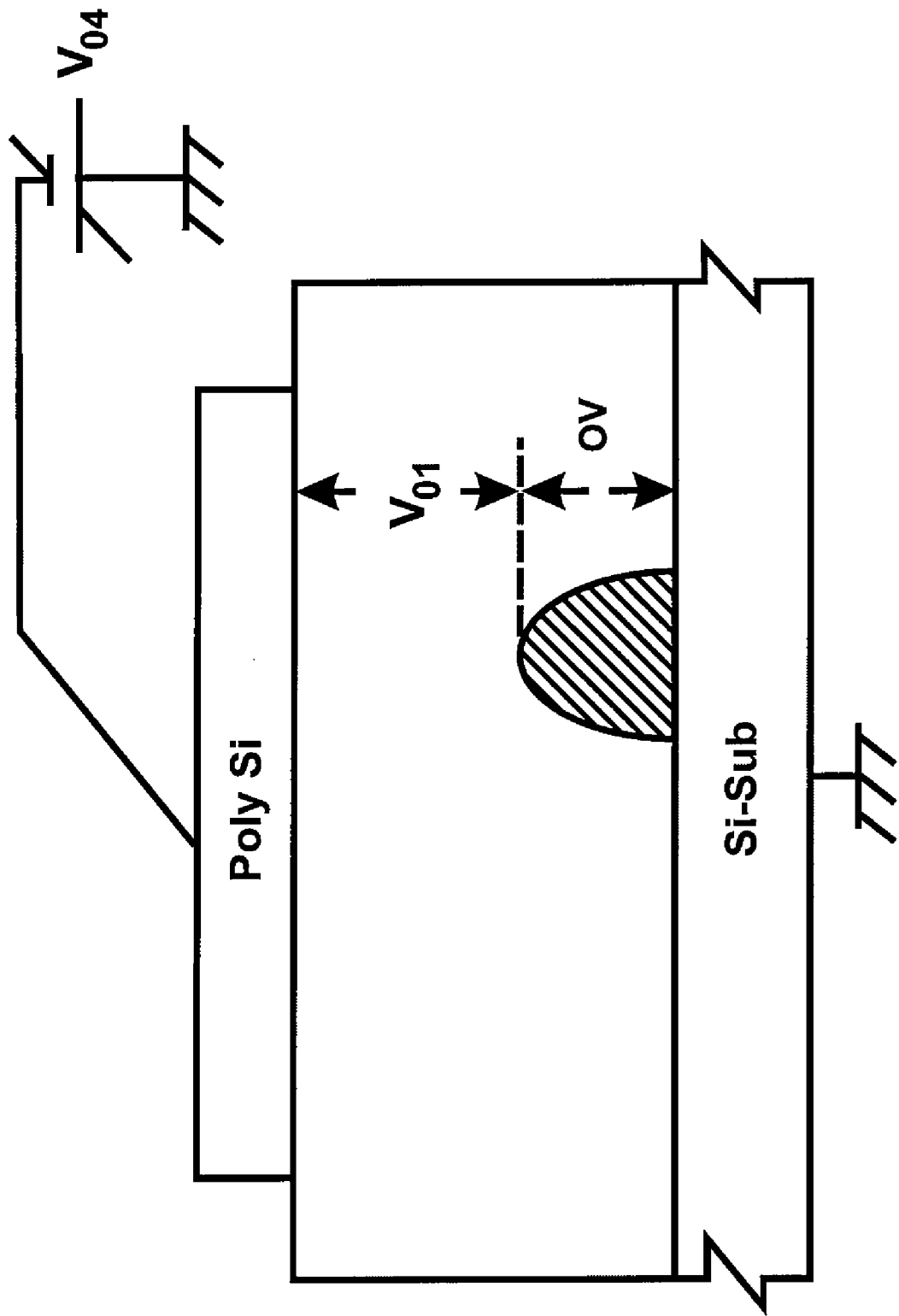

Modeling oxide defects as "effective oxide thinning" by an amount of ΔXox is illustrated in the simplified diagram of FIG. 13. We have also provided the relationship as follows:

$$VBD^2/RGXeff*\exp(-GXeff/VBD)=\tau_0 \quad \text{Equation (2)}$$

where
R is the ramp rate; and
Xeff=Xox−ΔXox.

From the above equation, we can relate VBD with ΔXox. We relate equation (1) and (2) to derive the equation for Vbd and J@ a given stress voltage (V):

$$J\sim AV^2/(Vbd*[\ln(V^2bd)]^2)*\exp[-Vbd*\ln(V^2bd)/V] \quad \text{Equation 3}$$

As shown, the above example is merely an illustration and should not unduly limit the scope of the claims herein. One of ordinary skill in the art would recognize many variations, modifications, and alternatives. In order to satisfy a desire of fast WLRC to reduce the cycle time of the product and the cost, we have provided new ramp test methodologies in combination of the above methods and systems according to embodiments of the present invention. The double-point GOI tests are proved effective from production records. Of course, there can be other variations, modifications, and alternatives.

REFERENCES

[1] Michel Depas, Tanya Nigan, and Marc M. Heyns, "Soft Breakdown of Ultra-Thin Gate Oxide Layers", IEEE Transactions on Electronic Devices, Vol. 43, No. 9, September 1996, pp 1499-1504.
[2] Eric S. Snyder, John Suchle, "Detecting Breakdown in Ultra-thin Dielectrics Using a Fast Voltage Ramp", International Integrated Reliability Workshop Final Report, 1999, pp. 118-123.
[3] C.Y. Chang, et al., Reliability of ultra-thin gate oxides for ULSI devices, Microelectronics Reliability, 39, 553 (1999).

The various embodiments may be implemented as part of a computer system and other test system, including computer codes. The computer system may include a computer, an input device, a display unit, and an interface, for example, for accessing the Internet. The computer may include a microprocessor. The microprocessor may be connected to a data bus. The computer may also include a memory. The memory may include Random Access Memory (RAM, e.g. DRAM, SRAM, Flash) and Read Only Memory (ROM). The computer system may further include a storage device, which may be a hard disk drive or a removable storage drive such as a floppy disk drive, optical disk drive, jump drive and the like. The storage device can also be other similar means for loading computer programs or other instructions into the computer system.

As used herein, the term 'computer' may include any processor-based or microprocessor-based system including systems using microcontrollers, digital signal processors (DSP), reduced instruction set circuits (RISC), application specific integrated circuits (ASICs), logic circuits, and any other circuit or processor capable of executing the functions described herein. The above examples are exemplary only, and are thus not intended to limit in any way the definition and/or meaning of the term 'computer'. The computer system executes a set of instructions that are stored in one or more storage elements, in order to process input data. The storage elements may also hold data or other information as desired or needed. The storage element may be in the form of an information source or a physical memory element within the processing machine.

The set of instructions may include various commands that instruct the processing machine to perform specific operations such as the processes of the various embodiments of the invention. The set of instructions may be in the form of a software program. The software may be in various forms such as system software or application software. Further, the software may be in the form of a collection of separate programs, a program module within a larger program or a portion of a program module. The software also may include modular programming in the form of object-oriented programming. The processing of input data by the processing machine may be in response to user commands, or in response to results of previous processing, or in response to a request made by another processing machine.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What is claimed is:

1. A method for testing a semiconductor wafer using a multi-point probing process, the method comprising:
   providing a semiconductor wafer, including one more patterns thereon;
   applying an operating voltage on a gate of a test pattern device on the semiconductor wafer using one or more probing devices;
   measuring a first leakage current associated with the operating voltage;
   determining if the measured first current is higher than a first predetermined amount,
   categorizing the device as an initial failure if the measured first current is higher than the first predetermined amount;
   storing a first indication associated with the initial failure if the device has been categorized as the initial failure;
   applying a second voltage to the gate of the test pattern device of the semiconductor wafer if the measured first current is below the first predetermined amount;
   measuring a second leakage current associated with the second voltage using one or more probing devices;
   categorizing the device as an extrinsic failure if the second measured leakage current is higher than a second predetermined amount;
   storing a second indication associated with the extrinsic failure if the device has been categorized as the extrinsic failure;
   categorizing the device as a good device if the second measured leakage current is below the second predetermined amount; and
   storing a third indication associated with the good device, if the device has been categorized as the good device.

2. The method of claim 1, wherein the operating voltage ranges from about 1.3 to about 3.3 volts.

3. The method of claim 1, wherein the semiconductor wafer is a partially completed wafer including a scribe region.

4. The method of claim 1, wherein the gate of the test pattern device is overlying a dielectric layer, the dielectric layer having a thickness of about 40 Angstroms and less.

5. The method of claim 1, wherein the one or more patterns comprises one or more MOS transistor structures having a channel width of about 95 nanometers and less.

6. The method of claim 1, wherein the measuring of the first leakage current is provided using one or more other probing devices.

7. The method of claim 1, wherein the one or more probing devices is coupled to a test station.

8. The method of claim 1, wherein the storing of the first indication or the storing of the second indication or the storing of the third indication is provided using one or more memories coupled to a test system.

9. The method of claim 1, wherein the initial failure is a total failure.

10. The method of claim 1, wherein the good device is within an acceptable operating specification.

11. The method of claim 1, wherein the first determined amount ranges from about a first amount to about a second amount for the semiconductor wafer having one or more MOS transistor structures having a channel width of about 95 nanometers and less.

12. The method of claim 1, wherein the second determined amount ranges from about a first amount to about a second amount for the semiconductor wafer having one or more MOS transistor structures having a channel width of about 95 nanometers and less.

13. A computer-readable storage medium storing a plurality of instructions for testing a semiconductor wafer using an in-line process control, the plurality of instructions comprising instructions that cause a processor to: apply an operating voltage on a gate of a test pattern on a semiconductor wafer using one or more probing devices; measure a first leakage current associated with the operating voltage; determine if the measured first current is higher than a first predetermined amount to indicate an initial failure; determine if the measured first current is below the first predetermined amount to indicate that the device is subjected to a second voltage; apply the second voltage on the gate of the test pattern on the semiconductor wafer; measure a second leakage current associated with the second voltage; determine if the second measured leakage current is higher than a second predetermined amount to indicate the device is an extrinsic failure; determine if the second measured leakage current is below the second predetermined amount to indicate the device a good device.

* * * * *